United States Patent [19]
Götz et al.

[11] Patent Number: 5,617,454
[45] Date of Patent: Apr. 1, 1997

[54] TRANSMISSION SYSTEM

[75] Inventors: Hans-Joachim Götz; Markus Brachmann; Georg Frank, all of Nürnberg; Thomas Eckart, Emskirchen, all of Germany

[73] Assignee: U.S. Philips Corporation, New York, N.Y.

[21] Appl. No.: 503,076

[22] Filed: Jul. 14, 1995

[30] Foreign Application Priority Data

Jul. 15, 1994 [DE] Germany .......................... 44 25 087.8

[51] Int. Cl.⁶ .................................................. H03D 3/24
[52] U.S. Cl. .............................. 375/376; 331/18; 331/25; 331/57
[58] Field of Search .................................... 375/376, 371, 375/373; 331/1 A, 1 R, 17, 18, 25, 34, 27, 57, DIG. 2

[56] References Cited

U.S. PATENT DOCUMENTS 5,068,628  11/1991  Ghoshal ..................................... 331/27
5,136,260   8/1992  Youselfi-Elezei ......................... 331/17
5,399,995   3/1995  Kardontchik et al. .................... 331/57
5,459,766  10/1995  Huizer et al. ............................. 375/376

FOREIGN PATENT DOCUMENTS

404268A2  12/1990  Germany .

*Primary Examiner*—Stephen Chin
*Assistant Examiner*—Thuy L. Nguyen
*Attorney, Agent, or Firm*—Michael E. Schmitt

[57] ABSTRACT

The invention relates to a transmission system comprising a phase-locked loop (12) which includes a phase comparator (15) for comparing an oscillator signal with a reference signal and for generating a comparison signal, and an oscillator which is provided for receiving a control signal derived from the comparison signal. The oscillator arranged as a ring oscillator (14) comprises at least one delay element (27 to 31) included in a closed circuit. At least one delay element (27 to 30) has at least two different adjustable delay times. A controller (19) is provided for setting the delay times of at least one delay element (27 to 30) in dependence on the comparison signal.

19 Claims, 3 Drawing Sheets

5,617,454

TRANSMISSION SYSTEM

BACKGROUND OF THE INVENTION

The invention relates to a transmission system comprising a phase-locked loop which includes
- a phase comparator for comparing an oscillator signal with a reference signal and for generating a comparison signal, and
- an oscillator which is provided for receiving a control signal derived from the comparison signal.

Such a transmission system in which data of an incoming signal are written in a buffer is known from EP 0 404 268 A2. The data read from the buffer form an outgoing signal. A write address generator (for example a counter) generates write addresses for writing data in the buffer. For this purpose, the write address generator is supplied with a write clock signal derived from the incoming signal. The read operation is controlled by a read address generator (for example, a counter) which receives a read clock signal. Justification and control data occurring in the incoming signal are not further transported in the outgoing signal by the transmission system. A subtraction of the write and read addresses is then effected which yields a reference signal for a phase-locked loop. The phase-locked loop which comprises a phase comparator and an oscillator forms the read clock signal based upon the comparison between the reference signal and the oscillator signal in the phase comparator, from which comparison signal the read clock signal is derived.

The phase-locked loop used in the transmission system still utilizes components for which it is impossible to integrate them with the technology in which the other components of the transmission system are realised. The phase-locked loop comprises components in ECL technology and further discrete components, whereas the other components of the transmission system are integrated in CMOS technology in at least one integrated circuit.

Therefore, it is an object of the invention to provide a transmission system of the type defined in the opening paragraph, in which the essential components of the phase-locked loop are realised in the same technology as the other components of the transmission system.

SUMMARY OF THE INVENTION

This object is achieved by a transmission system of the type defined in the opening paragraph in that the oscillator arranged as a ring oscillator comprises at least one delay element included in a closed circuit, in that a delay element has at least two different adjustable delay times and in that a controller is provided for setting the delay times of at least one delay element in dependence on the comparison signal.

The transmission system according to the invention comprises a phase-locked loop which includes a ring oscillator with delay elements arranged in a closed circuit. This ring oscillator is to comprise at least one adjustable delay element whose input and output are connected. The frequency and phase of the oscillator signal generated by the ring oscillator can be adjusted in that various delay times of the ring oscillator are changed. Such a delay element may have more than two different delay times. For effecting a simple control of the ring oscillator, a plurality of delay elements having two different quasi-equal delay times are to be combined to form the closed circuit. Not all the delay elements need to be adjustable then. A controller receives a signal which is derived from the comparison signal formed by the phase comparator and produces a control signal for setting the delay times of the adjustable delay elements. These components of the phase-locked loop may be realised in CMOS technology as a result of which the manufacturing process of the transmission system is simplified.

A simple embodiment for the controller for setting the delay time of the delay elements included in the ring oscillator comprises a shift register which includes shift elements. The number of shift elements arranged for setting the delay time of an assigned delay element corresponds to the number of adjustable delay elements. A first group of shift elements is arranged for setting a first delay time and/or at least a second group of shift elements is arranged for setting a second delay time, all based upon the comparison signal. If the delay elements have only two adjustable delay times, there will be two groups of delay elements. If the comparison signal changes, so will the ratio change of the number of delay elements of the first to those of the second group. With extreme ratios, all the delay elements may be assigned to one group.

A shift element comprises a first flip-flop and a first change-over switch which has a first and a second input and is arranged upstream of the input of the first flip-flop and controlled in dependence on the comparison signal. The first and second inputs of a first change-over switch of a shift element represent the first and second inputs of the shift element and the output of the first flip-flop of the shift element represents the output of the shift element. The shift elements are set by shifting a logic "1" (first state) and a logic "0" (second state) in the shift register. A first shift element has a first state at its first input and a last shift element has a second state at its second input. Each output of the other shift elements arranged between the first and last shift elements is coupled to the first input of one neighbouring shift element and to the second input of the other neighbouring shift element.

An adjustable delay element of the ring oscillator comprises a second change-over switch which, controlled by the controller, is arranged for coupling the input of the delay element to its output via at least two different delay paths. On a delay path having the shorter delay time, there is, for example, no further component available. The delay path having the longer delay time may include, for example, two inverters connected in series.

A delay path may also include at least one inverter whose delay time can be adjusted via the output load. The output load is realised by coupling one or a plurality of additional gates (inverters) to the output of the inverter in the delay path. An output load may be realised by one or a plurality of inverters, capacitances, additional lines and so on. If two different delay paths include two inverters having different output loads, the delay time may be adjusted in even smaller steps, because the delay time resulting from the output load is increased by a fraction of a delay time of the gate.

To avoid two change-over switches changing over at the instant when there is a change of edge of the signal passing through the adjustable delay element and the ring oscillator, a synchronizing unit is provided. The second change-over switch of the adjustable delay element is then arranged for receiving a change-over signal from the first change-over switch of the assigned shift element via the synchronizing unit of a delay element. The synchronizing unit is thus arranged for synchronizing the change-over signal with the output signal of the delay element. This measure avoids noise pulses during the change over.

In an embodiment of the phase comparator which is simple to realise, this phase comparator comprises a counter arrangement and a combining circuit. The counter arrangement is used for counting the clock cycles of the oscillator signal during a clock cycle of a reference clock signal, and the combining circuit is arranged for generating the comparison signal by a combination of the count and the nominal phase value. Alternatively, it is possible to use the number of clock cycles of the reference clock signal during a clock cycle of the oscillator signal as a count. The frequency of the reference clock signal should then be larger than that of the oscillator signal.

The phase-locked loop in the transmission system is used for reducing the jitter in the outgoing signal. To achieve a further reduction of jitter, the phase comparator additionally includes flip-flop arrangements and an evaluation circuit. Flip-flop arrangements assigned to each delay element are provided for storing the output state of each delay element at reference instants defined by the reference clock signal. The evaluation circuit is used for determining a phase value at a reference instant based upon the stored output states of the delay elements and upon the set delay times of the delay elements. The combining circuit is further arranged for combining the phase value with the nominal phase value and the count.

A flip-flop arrangement may be formed by an Exclusive-OR gate, a flip-flop and a detection circuit. The output states of two consecutive delay elements are combined in an Exclusive-OR gate and the output state of the Exclusive-OR gate is stored in the flip-flop. The detection circuit is used for detecting whether a low-order or high-order state is stored in the flip-flop. In another embodiment of a flip-flop arrangement, a second flip-flop is used for storing a high-order output state and a third flip-flop for storing a low-order output state of the assigned delay element.

If the ring oscillator contains an even number of adjustable delay elements, there is additionally an inverter as a non-adjustable delay element present in the closed circuit.

The calculation of the phase value is made according to the following formula in the evaluation circuit: The phase value $\Phi$ is:

$$\Phi = 2\pi \frac{xT_v}{2[NT_v + (N-n)\Delta T + T_i]} = \Phi_{P1},$$

if the number x of the flip-flop arrangements storing the high-order output state is smaller than or equal to the number n of the delay elements set to a first delay time which is shorter than the second delay time, $$\Phi = \Phi_{P1} + II,$$

if the number x of the flip-flop arrangements storing the low-order output state is smaller than or equal to the number n of the delay elements set to a first delay time, $$\Phi = 2\pi \frac{nT_v + (x-n)\Delta T}{2[NT_v + (N-n)\Delta T + T_i]} = \Phi_{P2},$$

if the number x of the flip-flop arrangements storing the high-order output state is greater than the number n of the delay elements set to a first delay time, and $$\Phi = \Phi_{P2} + II,$$

if the number x of the flip-flop arrangements storing the low-order output state is greater than the number n of the delay elements set to a first delay time. Then N is the total number of delay elements, $T_v$ the first delay time, $T_v + \Delta T$ the second delay time and $T_i$ the delay time of the delay element arranged as an inverter.

A sigma-delta-modulator which may have three different states for producing an output signal is arranged between the phase comparator and the controller. The three states mean that with a high-order state of a signal derived from the output signal of the sigma-delta-modulator a first flip-flop in a first state is provided to change to a second state, with a low-order state of the signal a first flip-flop in a second state is provided to change to a first state and when the signal has a middle state, no first flip-flop is provided to change its state. With the high-order and the low-order states in the shift register, always the initial state of a flip-flop of a shift element is changed. In the other case, the state of the shift register does not change.

The transmission system is especially used for separating justification and control data from a signal. For this purpose, there are provided a buffer memory for buffering data of a first signal with a first bit rate and for forming a second signal with a second bit rate, a write address generator for receiving a write clock signal derived from the first signal and for producing write addresses, a read address generator for receiving a read clock signal derived from the oscillator signal of the phase-locked loop and for producing read addresses, a subtracter for subtracting the read and write addresses formed by the read and write address generators and for producing a difference signal, and the phase-locked loop for receiving the nominal phase value derived from the difference signal.

The invention likewise relates to a phase-locked loop which comprises a phase comparator for comparing an oscillator signal with a reference signal and for producing a comparison signal, and an oscillator which is provided for receiving a control signal derived from the comparison signal. The oscillator arranged as a ring oscillator comprises at least one delay element included in a closed circuit. At least one delay element has at least two different adjustable delay times. A controller is provided for setting the delay times of at least one delay element in dependence on the comparison signal.

These and other aspects of the invention will be apparent from and elucidated with reference to the embodiments described hereinafter.

DESCRIPTION OF THE PREFERRED EMBODIMENT OF THE INVENTION

Figure 1:
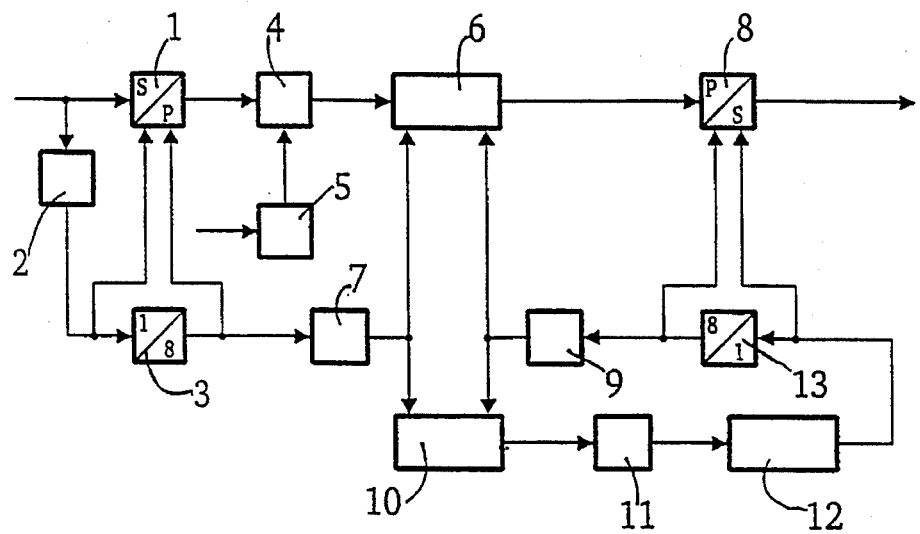
FIG. 1 shows a transmission system comprising a phase-locked loop.

In the illustrative embodiment of a transmission system shown in FIG. 1, justification and control data are separated from a first incoming signal and a second outgoing signal is formed. The first signal is, for example an STM-1 signal of the synchronous digital hierarchy and has a bit rate of 155.52 Mbit/s. The second signal is a plesiochronous signal having a bit rate of 139.264 Mbit/s.

In a deserializer 1 the serial first signal is converted into a parallel signal with 8-bit data blocks. The deserializer 1 receives a first clock signal generated by a clock recovery circuit 2 and a second clock signal which has been formed from the first clock signal by a divider 3 which has a dividing ratio of 1:8. The data blocks of the first signal are applied to a selection matrix 4 which is further described in EP-0 404 268 A2 and the justification data and control data are separated from the first signal. The selection matrix is controlled by a controller 5 which receives information previously separated from the first signal. This separation is not further shown here.

The data blocks produced by the selection matrix 4 are written in a buffer 6 match the clock signals. For the write operation, a write address generator 7 arranged as a counter and receiving a write clock signal, produces write addresses. The write clock signal is the second clock signal which is formed by the divider 3. The data blocks read from the buffer 6 are produced as a serial second signal by a serializer 8. The read addresses for the read operation are supplied by a read address generator 9 which is also arranged as a counter.

To have little jitter in the outgoing second signal, a main control loop is provided to comprise a subtracter 10, a low-pass filter 11, a phase-locked loop 12, the divider 13 and a read address generator 9. In the subtracter 10 is formed the difference between read addresses and write addresses and this difference is applied to the low-pass filter 11 as a difference signal. The phase-locked loop receives the nominal phase value from the low-pass filter 11 and generates an oscillator signal which is applied to the divider 13 which has a dividing ratio of 1:8 and to the serializer 8. The divider 13 generates a read clock signal which is applied to the serializer 8 and to the read address generator 9.

Figure 2:
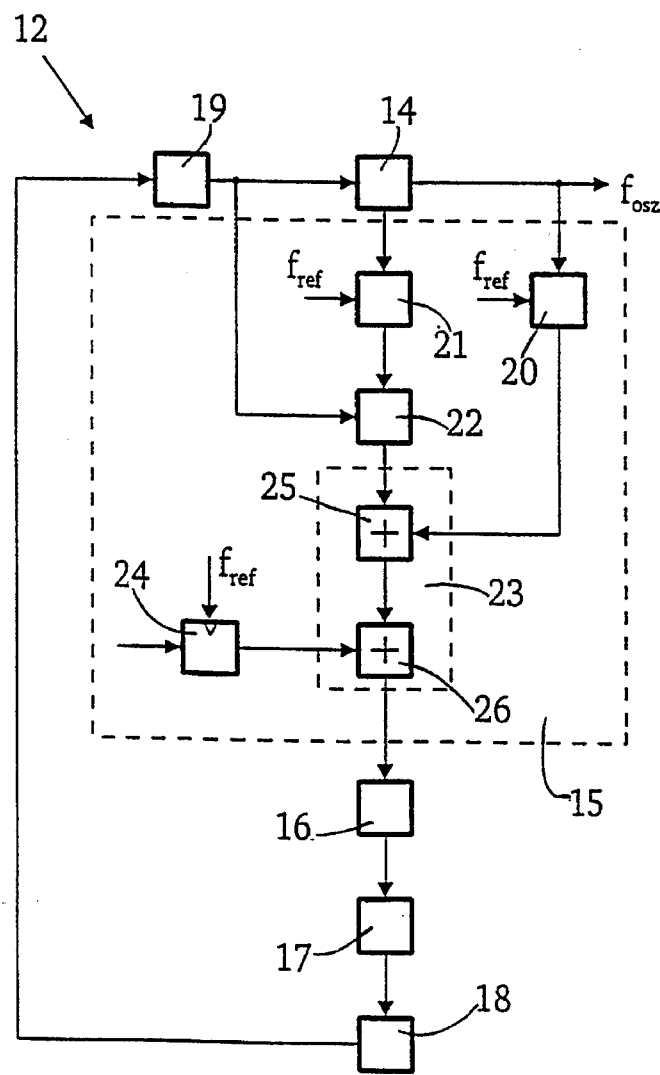
FIG. 2 gives a diagrammatic representation of a phase-locked loop that can be used in the transmission system shown in FIG. 1.

An illustrative embodiment for the phase-locked loop 12 is shown in FIG. 2 as a block diagram. The phase-locked loop 12 comprises a ring oscillator 14, a phase comparator 15, a low-pass filter 16, a sigma-delta-modulator 17, a subtracter circuit 18 and a controller 19. The ring oscillator 14 generates the oscillator signal which is applied to the divider 13 and the phase comparator 15.

The phase comparator 15 comprises a counter arrangement 20, flip-flop arrangements 21, an evaluation circuit 22, a combining circuit 23 and a register 24. The counter arrangement 20 receives the oscillator signal from the ring oscillator 14 and counts the clocks during a clock cycle of a reference clock signal with the frequency $f_{ref}$. The frequency $f_{ref}$ of the reference clock signal is smaller than the frequency $f_{OSZ}$ of the oscillator signal. The oscillator clock pulses counted in the counter arrangement 20 during a clock cycle of the reference clock signal are fed as a count to a first adder 25 of the combining circuit 23. The adder 25 furthermore receives phase values from the evaluation circuit 22 which is coupled to the output of the controller 19 and the outputs of the flip-flop arrangements 21. The flip-flop arrangements 21 are connected each to delay elements included in the ring oscillator 14. If there are no strict requirements as regards jitter, the flip-flop arrangements 21 and the evaluation circuit 22 are not necessary. An illustrative embodiment for a controller 19, a ring oscillator 14, the flip-flop arrangements 21 and the evaluation circuit 22 is shown in FIG. 3 and will be further explained below.

The combining circuit 23 includes one more adder 26 which receives the result of the additions of phase values and counts from the adder 25. The adder 26 furthermore receives the nominal phase value stored in the register 24 which is taken over, for example, by a low-pass filter 11 in the event of a rising edge of the reference clock signal. The consecutive values produced by the adder 26 or the combining circuit 23 respectively, form the comparison signal. This comparison signal is applied to the controller 19 via the low-pass filter 16, the sigma-delta-modulator 17 and the subtracter 18. The sigma-delta-modulator 17 produces an output signal which has a high-order, a middle and a low-order state. For example, this is expressed by the values "1" "0" and "−1". The subtracter 18 is used for compensating for the integrating behaviour of the evaluation circuit 22. The output of the controller 19 has—as discussed above—a connection to the evaluation circuit 22 and the ring oscillator 14.

Figure 3:
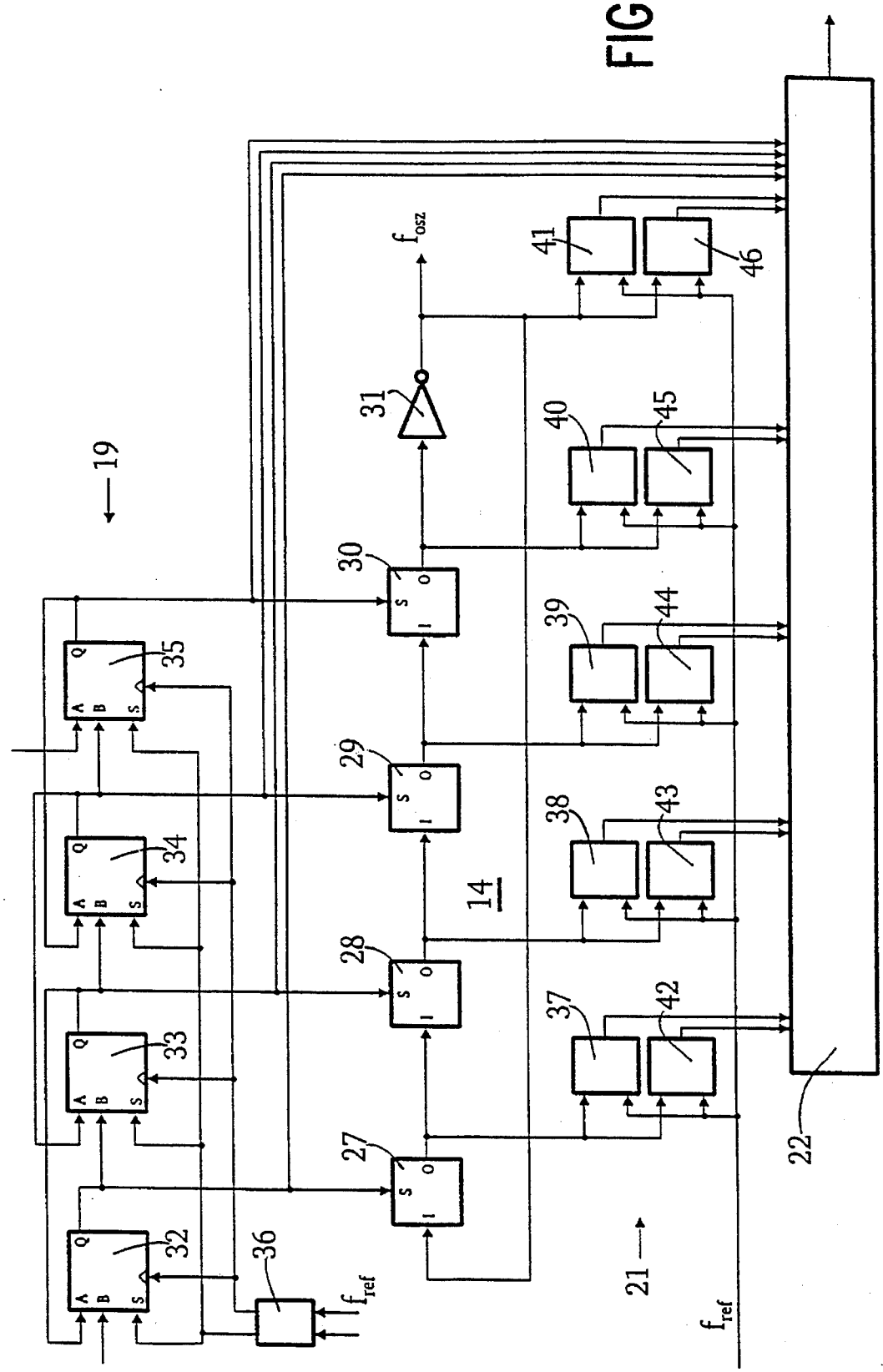
FIG. 3 shows a part of the phase-locked loop comprising controller, ring oscillator, flip-flop arrangements and evaluation circuit.

In FIG. 3 is shown an illustrative embodiment for a ring oscillator 14 which has 5 delay elements 27 to 31. The delay elements 27 to 31 are arranged in series and the output of the last delay element 31 is connected to the input of the first delay element 27. The last delay element 31 also produces the oscillator signal with the frequency $f_{OSZ}$. The delay times of the delay elements 27 to 30 can be adjusted via the controller 19 to set the frequency of the ring oscillator 14. The controller 19 comprises a shift register which includes 4 shift elements 32 to 35. One shift element 32 to 35 is assigned to each adjustable delay element 27 to 30. For example, shift element 33 controls delay element 28.

Figure 4:
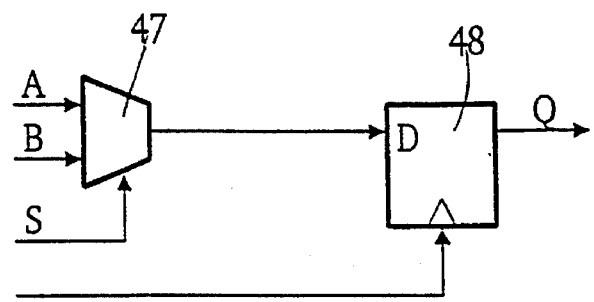
FIG. 4 shows a shift element included in the controller shown in FIG. 3.

An illustrative embodiment for a shift element 32 to 35 is shown in FIG. 4. A shift element 32 to 35 comprises a first change-over switch 47 and a first D-flip-flop 48. The change-over switch 47 connects one of its inputs A or B to its output which is connected to the D-input of the flip-flop 48. The control input S of the change-over switch 47 receives a signal formed from the output signal of the subtracter 18. The clock input of the D-flop-flop 48 receives a shift clock signal which may be derived from the reference clock signal. The output of the D-flip-flop 48 is also the output Q of a shift element 32 to 35.

The input B of the first shift element 32 has a high-order state (logic "1") and the input A of the last shift element 35 of the shift register has a low-order state (logic "0"). This means that the input B of the shift element 32 is supplied with a logic "1" and the input A of the shift element 35 is supplied with a logic "0". An output Q of a shift element 32, 33 and 34 is connected to the input B of a shift element 33, 34 and 35. Furthermore, an output Q of a shift element 35, 34 and 33 is connected to the input A of a shift element 34, 33 and 32. The control inputs and the clock inputs of the shift elements 32 to 35 are supplied each with a control signal and a clock signal by a decoder 36, which decoder receives the output signal of the subtracter 18 and the reference clock signal. In the case of a high-order state (logic "1") of the output signal of the subtracter 18, the decoder 36 produces a control signal at the occurrence of which the first change-over switch 47 of each shift element 32 to 35 connects the input A to its output. The first change-over switch 47 of each shift element 32 to 35 forms a connection between its output and the input B if the output signal of the subtracter 18 has a low-order state (logic "−1"). In the case of a middle state (logic "0"), the decoder 36 does not transport the reference clock signal any further, so that the contents of the first flip-flop 48 of the shift elements 32 to 35 cannot be changed.

The output signals of the shift elements 32 to 35 are used for setting the delay of the assigned delay elements 27 to 30.

If a high-order state is stored in the D-flip-flop 48 of the shift element 32, a short delay time is set in the assigned delay element 27. A long delay time is set in the delay element 29 if a low-order state is present in the D-flip-flop 48 of the assigned shift element 34. As a result, when the shift elements 32 to 35 are in these states, a first group of shift elements (32 and 33) is arranged for setting a first, short delay time and a second group of shift elements (34 and 35) is provided for setting a second, long delay time. Thus the part of the shift elements 32 to 35 belonging to a first or a second group are controlled in dependence on the comparison signal of the phase comparator 15, from which the output signal of the sigma-delta-modulator is derived.

To the output of each delay element 27 to 31 are connected flip-flop arrangements 21 which comprise each a second flip-flop 37 to 41 and a third flip-flop 42 to 46. The flip-flops 37 to 46 may be RS-flip-flops which are set either by a positive edge or a negative edge of the oscillator signal that passes through the delay elements 27 to 31. The flip-flops 37 to 41 are set by the assigned delay elements 27 to 31 each time via a positive edge of the oscillator signal and the flip-flops 42 to 46 are set by the assigned delay elements 27 to 31 each time via a negative edge of the oscillator signal. The flip-flops are reset, for example, by a positive edge of the reference clock signal.

The evaluation circuit 22 determines the states of the flip-flops 37 to 46 at a reference instant, for example, when a negative edge of the reference clock signal occurs. Thus there can be established in which delay element 27 to 31 either a positive or negative edge of the oscillator signal occurs at the reference instant. The evaluation circuit 22 further receives the output signals of the shift elements 32 to 35. The phase value Φ supplied by the evaluation circuit 22 is calculated according to the following formulae:
1) x≦n:

$$\Phi = 2\pi \frac{xT_v}{2[NT_v + (N-n)\Delta T + T_i]} = \Phi_{P1},$$

where x is the number of flip-flops 37 to 41 containing a stored positive edge of the oscillator signal, n is the number of delay elements 27 to 30 which have a shorter delay time, N is the total number of delay elements, $T_v$ is the shorter delay time, $T_v+\Delta T$ is the longer delay time and $T_i$ is the delay time of the delay element 31 arranged as an inverter:
2) x≦n:

$$\Phi = \Phi_{P1} + II,$$

where x is in this case the number of flip-flops 42 to 46 containing a stored negative edge of the oscillator signal;
3) x>n:

$$\Phi = 2\pi \frac{nT_v + (x-n)\Delta T}{2[NT_v + (N-n)\Delta T + T_i]} = \Phi_{P2},$$

where x is in this case the number of flip-flops 37 to 41 containing a stored positive edge of the oscillator signal;
4) x>n:

$$\Phi = \Phi_{P2} + II,$$

where x is in this case the number of flip-flops 42 to 46 containing a stored negative edge of the oscillator signal.

The evaluation circuit 22 containing, for example, a Table, thus first detects whether a negative or positive edge has been stored and then calculates the phase value while implementing the formulas.

Figure 5:
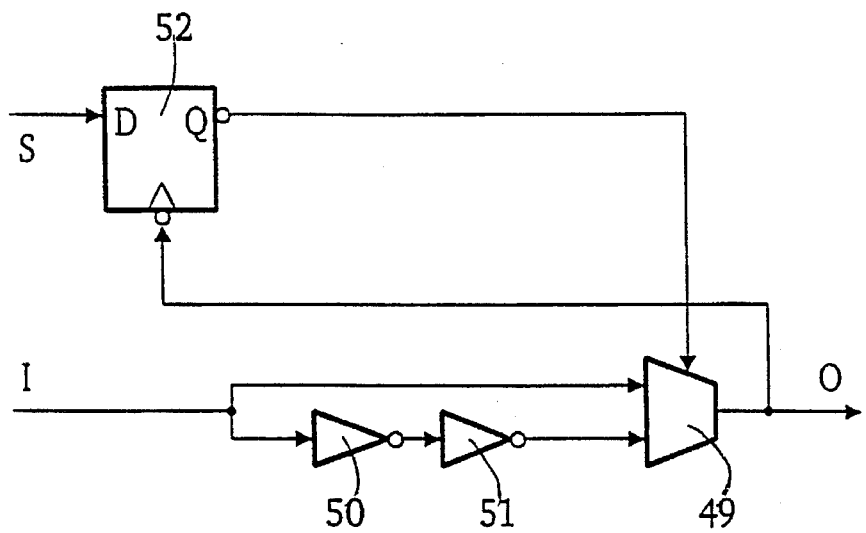
FIG. 5 shows a first illustrative embodiment for an adjustable delay element included in the ring oscillator shown in FIG. 3.

In the following will be explained illustrative embodiments for adjustable delay elements 27 to 30. The delay element shown in FIG. 5 comprises a second change-over switch 49, two consecutively arranged inverters 50 and 51 and a synchronizing unit 52. The input I of the delay element is connected, on the one hand, directly to the change-over switch 49 and, on the other hand, indirectly, via the consecutively arranged inverters 50 and 51, to the change-over switch 49. The output of the change-over switch 49 also forms the output of the delay element. The signal for controlling the change-over switch 49 is supplied to the change-over switch 49 via the synchronizing unit 52. The synchronizing unit 52 comprises a D-flip-flop whose D-input receives the signal from a shift element 32 to 35 and whose inverting output is connected to the control input of the change-over switch 49. The clock input of the D-flip-flop receives the inverted output signal from the change-over switch 49. Noise pulses are avoided by means of the synchronizing unit 52. The change-over switch 49 connects either the input directly to its output (first delay path), or the output of the second inverter 51 to its own output (second delay path), all this depending on the signal received through its control input.

Figure 6:
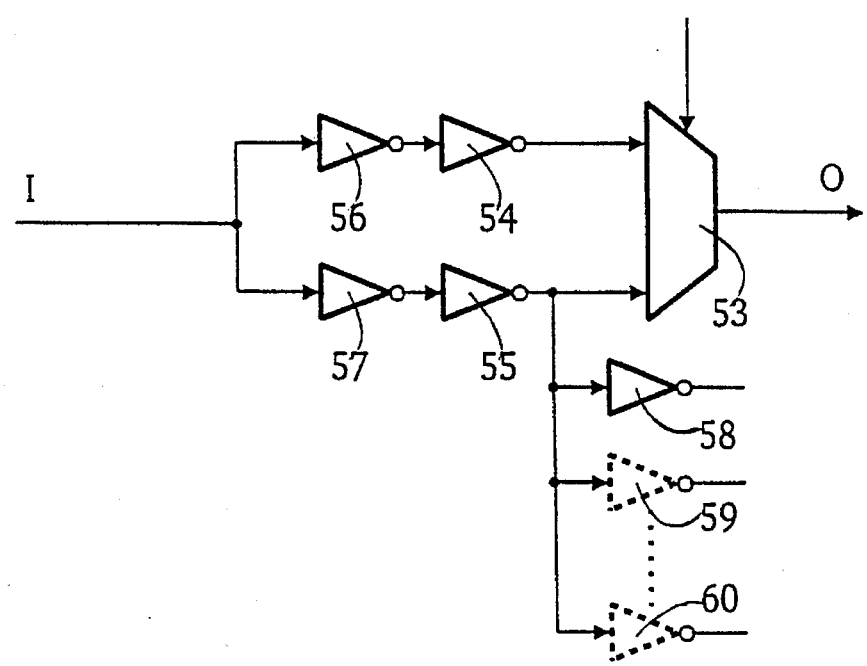
FIG. 6 shows a second illustrative embodiment for an adjustable delay element included in the ring oscillator shown in FIG. 3.

FIG. 6 shows a delay element in which a change-over switch 53 connects its output either to a first inverter 54 or a second inverter 55. Inverters 56 and 57 are further arranged to precede the two inverters 54 and 55, respectively. The second inverter 55 is coupled with its output to at least a further inverter 58 which represents an output load for the inverter 55. The output of the inverter 58 is open. As a result, the delay time of the inverter 55 will change. This delay time is then changed less than an inverter delay time (gate delay time). Such delay modules make a finer tuning of the oscillator frequency and oscillator phase possible and thus a further reduction of the jitter in the second signal formed by the transmission system. The output load of the inverter 55 can further be increased by connecting one or more inverters 59 to 60 shown in dotted lines in parallel with the inverter 58.

We claim:
1. Transmission system comprising a phase-locked loop which includes
a phase comparator for comparing an oscillator signal with a reference signal and for generating a comparison signal, and
an oscillator which is provided for receiving a control signal derived from the comparison signal, characterized in that the oscillator arranged as a ring oscillator comprises at least one delay element included in a closed circuit, in that at least one delay element has at least two different adjustable delay times, and in that a controller is provided for setting the delay times of at least one delay element in dependence on the comparison signal, and characterized further in that the controller comprises a shift register which includes shift elements of which the number corresponds to the number of adjustable delay elements, in that a shift element is arranged for setting the delay time of an assigned delay element and in that a first group of shift elements is arranged for setting a first delay time and/or at least a second group of shift elements is arranged for setting a second delay time, all based upon the comparison signal.

2. Transmission system as claimed in claim 1, characterized in that a shift element comprises a first flip-flop and a first change-over switch which has a first and a second input and is arranged upstream of the input of the first flip-flop and controlled in dependence on the comparison signal, in that the first and second inputs of a first change-over switch of a shift element represent the first and second inputs of the shift element and the output of the first flip-flop of the shift element represents the output of the shift element, in that a first shift element has a first state at its first input and a last shift element has a second state at its second input, and in that the output of the other shift elements arranged between the first and last shift elements is coupled to the first input of one neighbouring shift element and to the second input of the other neighbouring shift element.

3. Transmission system as claimed in claim 2, characterized in that in the case of a high-order state of a signal derived from the output signal of a sigma-delta modulator a first flip-flop in a first state is provided to change to a second state, in the case of a low-order state of the signal a first flip-flop in a second state is provided to change to a first state and in that in the case of a middle state of the signal, no first flip-flop is provided to change its state.

4. Transmission system as claimed in claim 2, characterized in that an adjustable delay element comprises a second change-over switch which, controlled by the controller, is arranged for coupling the input of the delay element to its output via at least two different delay paths.

5. Transmission system as claimed in claim 4, characterized in that a delay path includes at least one inverter whose delay time can be adjusted via the output load.

6. Transmission system comprising a phase-locked loop which includes

- a phase comparator for comparing an oscillator signal with a reference signal and for generating a comparison signal, and
- an oscillator which is provided for receiving a control signal derived from the comparison signal, characterized in that the oscillator arranged as a ring oscillator comprises at least one delay element included in a closed circuit, in that at least one delay element has at least two different adjustable delay times, and in that a controller is provided for setting the delay times of at least one delay element in dependence on the comparison signal, and characterized further in that an adjustable delay element comprises a second change-over switch which, controlled by the controller, is arranged for coupling the input of the delay element to its output via at least two different delay paths.

7. Transmission system as claimed in claim 6, characterized in that a delay path includes at least one inverter whose delay time can be adjusted via the output load.

8. Transmission system as claimed in claim 7, characterized in that a second change-over switch of an adjustable delay element is arranged for receiving a change-over signal from the assigned shift element via a synchronizing unit of a delay element, and in that the synchronizing unit is arranged for synchronizing the change-over signal with the output signal of the delay element.

9. Transmission system, comprising a phase-locked loop which includes

- a phase comparator for comparing an oscillator signal with a reference signal and for generating a comparison signal, and
- an oscillator which is provided for receiving a control signal derived from the comparison signal, characterized in that the oscillator arranged as a ring oscillator comprises at least one delay element included in a closed circuit, in that at least one delay element has at least two different adjustable delay times, and in that a controller is provided for setting the delay times of at least one delay element in dependence on the comparison signal, end characterized further in that a second change-over switch of an adjustable delay element is arranged for receiving a change-over signal from a assigned shift element via a synchronizing unit of a delay element, and in that the synchronizing unit is arranged for synchronizing the change-over signal with the output signal of the delay element.

10. Transmission system as claimed in claim 9, characterized in that the phase comparator comprises

- a counter arrangement used for counting the clock cycles of the oscillator signal during a clock cycle of a reference clock signal, and
- a combining circuit arranged for generating the comparison signal by a combination of the count and the nominal phase value.

11. Transmission system as claimed in claim 10, characterized in the phase comparator comprises flip-flop arrangements assigned to each delay element for storing the initial state of each delay element at reference instants defined by the reference clock signal, in that an evaluation circuit is used for determining a phase value at a reference instant based upon the stored output states of the delay elements and upon the set delay time of a delay element, and in that the combining circuit is arranged for combining the phase value with the nominal phase value and the count.

12. Transmission system, comprising a phase-locked loop which includes

- a phase comparator for comparing an oscillator signal with a reference signal and for generating a comparison signal, and
- an oscillator which is provided for receiving a control signal derived from the comparison signal, characterized in that the oscillator arranged as a ring oscillator comprises at least One delay element included in a closed circuit, in that at least one delay element has at least two different adjustable delay times, and in that a controller is provided for setting the delay times of at least one delay element in dependence on the comparison signal, and characterized further in that the phase comparator comprises
- a counter arrangement used for counting the clock cycles of the oscillator signal during a clock cycle of a reference clock signal, and
- a combining circuit arranged for generating the comparison signal by a combination of the count and the nominal phase value.

13. Transmission system as claimed in claim 12, characterized in that the phase comparator comprises flip-flop arrangements assigned to each delay element for storing the output state of each delay element at reference instants defined by the reference clock signal, in that an evaluation circuit is used for determining a phase value at a reference instant based upon the stored output states of the delay elements and upon the set delay time of a delay element, and in that the combining circuit is arranged for combining the phase value with the nominal phase value and the count.

14. Transmission system as claimed in claim 13, characterized in that each flip-flop arrangement comprises a second flip-flop for storing a high-order output state and a third flip-flop for storing a low-order output state of the assigned delay element.

15. Transmission system as claimed in claim 14, characterized in that the ring oscillator contains an even number of adjustable delay elements and an inverter as a non-adjustable delay element.

16. Transmission system as claimed in claim 15, characterized in that the evaluation circuit calculates the phase value Φ by means of the following formula $$\Phi = 2\pi \frac{xT_v}{2[NT_v + (N-n)\Delta T + T_i]} = \Phi_{P1},$$

if the number x of the flip-flop arrangements storing the high-order output state is smaller than or equal to the number n of the delay elements set to a first delay time which is shorter than the second delay time, in that the evaluation circuit calculates the phase value Φ by means of the following formula $$\Phi = \Phi_{P1} + II,$$

if the number x of the flip-flop arrangements storing the low-order output state is smaller than or equal to the number n of delay elements set to a first delay time, in that the evaluation circuit calculates the phase value Φ by means of the following formula $$\Phi = 2\pi \frac{nT_v + (x-n)\Delta T}{2[NT_v + (N-n)\Delta T + T_i]} = \Phi_{P2},$$

if the number x of the flip-flop arrangements storing the high-order output state is greater than the number n of the delay elements set to a first delay, and in that the evaluation circuit calculates the phase value Φ by means of the following formula $$\Phi = \Phi_{P2} + II$$

if the number x of the flip-flop arrangements storing the low-order output state is larger than the number n of delay elements set to a first delay time, where n is the total number of delay elements, $T_v$ the first delay time, $T_v + \Delta T$ the second delay time, $\Delta T$ is the time increment between the first and the second delay times, and $T_i$ the delay time of the delay element arranged as an inverter.

17. Transmission system comprising a phase-locked loop which includes a phase comparator for comparing an oscillator signal with a reference signal and for generating a comparison signal, and an oscillator which is provided for receiving a control signal derived from the comparison signal, characterized in that the oscillator arranged as a ring oscillator comprises at least one delay element included in a closed circuit, in that at least one delay element has at least two different adjustable delay times, and in that a controller is provided for setting the delay times of at least one delay element in dependence on the comparison signal, and characterized further in that a sigma-delta modulator inserted between the phase comparator and controller is arranged for generating an output signal which may have three different states.

18. Transmission system comprising a phase-locked loop which includes a phase comparator for comparing an oscillator signal with a reference signal and for generating a comparison signal, and an oscillator which is provided for receiving a control signal derived from the comparison signal, characterized in that the oscillator arranged as a ring oscillator comprises at least one delay element included in a closed circuit, in that at least one delay element has at least two different adjustable delay times, and in that a controller is provided for setting the delay times of at least one delay element in dependence on the comparison signal, and characterized further in that a buffer memory is provided for buffering data of a first signal with a first bit rate and for forming a second signal with a second bit rate, a write address generator for receiving a write clock signal derived from the first signal and for producing write addresses, a read address generator for receiving a read clock signal derived from the oscillator signal of the phase-locked loop and for producing read addresses, a subtracter for subtracting the read and write addresses formed by the read and write address generators and for producing a difference signal, and the phase-locked loop is arranged for receiving the nominal phase value derived from the difference signal.

19. Phase-locked loop comprising a phase comparator for comparing an oscillator signal with a reference signal and for producing a comparison signal and an oscillator arranged for receiving a difference signal derived from the comparison signal, characterized in that the oscillator arranged as a ring oscillator comprises at least one delay element included in a closed circuit, in that at least one delay element has at least two different adjustable delay times and in that a controller is arranged for setting the delay times of at least one delay element in dependence on the comparison signal, and characterized further in that the controller comprises a shift register which includes shift elements of which the number corresponds to the number of adjustable delay elements, in that a shift element is arranged for setting the delay time of an assigned delay element and in that a first group of shift elements is arranged for setting a first delay time and/or at least a second group of shift elements is arranged for setting a second delay time, all based upon the comparison signal.

\* \* \* \* \*